United States Patent
Feldtkeller

(10) Patent No.: US 9,654,087 B1
(45) Date of Patent: May 16, 2017

(54) LEVEL SHIFTER CIRCUIT

(71) Applicant: Infineon Technologies Austria AG, Villach (AT)

(72) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/177,544

(22) Filed: Jun. 9, 2016

(51) Int. Cl.
  *H03K 3/00* (2006.01)
  *H03K 3/356* (2006.01)
  *H03K 3/2885* (2006.01)

(52) U.S. Cl.
  CPC ..... *H03K 3/356086* (2013.01); *H03K 3/2885* (2013.01)

(58) Field of Classification Search
  CPC ..... H03K 19/018521; H03K 3/356113; H03K 19/00315; H03K 19/018528; G11C 8/08; G11C 5/145; G11C 7/12
  See application file for complete search history.

(56) References Cited

U.S. PATENT DOCUMENTS

| | | | |
|---|---|---|---|
| 2009/0085639 A1* | 4/2009 | Ueno | H03K 3/037 327/333 |
| 2011/0032019 A1 | 2/2011 | Saether | |
| 2013/0200938 A1* | 8/2013 | Yao | H03K 19/01752 327/365 |
| 2013/0229207 A1 | 9/2013 | Tseng et al. | |

OTHER PUBLICATIONS

"An introduction to LLC resonant half-bridge converter," Application Note AN2644, STMicroelectronics, Sep. 2008, 64 pp.
"Power Management, Selection Guide," Infineon Technologies AG, Feb. 2015, 182 pp.

* cited by examiner

*Primary Examiner* — Long Nguyen
(74) *Attorney, Agent, or Firm* — Shumaker & Sieffert, P.A.

(57) ABSTRACT

Techniques are disclosed for a level shifter configured to adjust current flow in response to measured current fluctuations due to common mode noise in the level shifter. For example, the level shifter includes a low-side control circuit configured to adjust a first current flowing into a first low-side terminal of an active high voltage level shifter device in response to a difference between the first low-side current and a second low-side current flowing into a second low-side terminal of an inactive high voltage level shifter device. The level shifter further includes a high-side receiver circuit configured to detect a difference between a first high-side current flowing into a first high-side terminal of the active high voltage level shifter device and a second high-side current flowing into a second high-side terminal of the inactive high voltage level shifter device.

20 Claims, 5 Drawing Sheets

LEVEL SHIFTER CIRCUIT

TECHNICAL FIELD

This disclosure generally relates to techniques for increasing the stability of high voltage level shifter circuits.

BACKGROUND

A level shifter is an electrical component that converts digital signals from a low-side voltage domain to into a high-side voltage domain. The input signals are connected to a ground in the low-side domain, while the output signals are connected to a ground in the high-side domain. Both the low-side ground and high-side ground are separate and electrically isolated from each other.

One type of level shifter is an Ultra-high Voltage (UHV) level shifter. UHV level shifters operate to convert a control signal from a low-side control circuit into a driver signal for a high-side gate driver of a half bridge circuit. A low-side control circuit generates the control signal and further drives a low-side switch of the half-bridge circuit. Therefore, the negative supply of the low-side domain is connected to the negative supply of the half-bridge. UHV level shifters typically are used in LLC converters or motor drives and have a half bridge supply voltage of approximately 400 V. In other words, the voltage difference between the high-side domain and low-side domain oscillates from 0 V to 400 V and back.

SUMMARY

In general, the disclosure describes techniques for a level shifter configured to adjust current flow in response to measured current fluctuations due to common mode noise in the level shifter. For example, the level shifter includes a low-side control circuit configured to adjust a first current flowing into a first low-side terminal of an active high voltage level shifter device in response to a difference between the first current and a second current flowing into a second low-side terminal of an inactive high voltage level shifter device. The level shifter further includes a high-side receiver circuit configured detect a difference between a first output current flowing from a first high-side terminal of the active high voltage level shifter device driven in an active state and a second output current flowing from a second high-side terminal of the inactive high voltage level shifter device.

In one example, this disclosure describes a high voltage level shifter configured to translate an input signal from a low-side low voltage domain to a high-side low voltage domain, the high voltage level shifter including: a first high voltage level shifter device, wherein the first high voltage level shifter device includes a first high-side terminal, a first low-side terminal, and a first control terminal, and wherein the first control terminal is configured to control a first current flowing into the first high-side terminal to the first low-side terminal; a second high voltage level shifter device, wherein the second high voltage level shifter device includes a second high-side terminal, a second low-side terminal, and a second control terminal, and wherein the second control terminal is configured to control a second current flowing into the second high-side terminal to the second low-side terminal; a low-side control circuit configured to drive the first control terminal and the second control terminal, wherein the low-side control circuit is further configured to drive, in response to the input signal, one of the first high voltage level shifter device and the second high voltage level shifter device to an active state while the other of the first high voltage level shifter device and the second high voltage level shifter device remains in an inactive state; a high-side receiver circuit configured to set a state of a high-side output signal in response to the one of the first high voltage level shifter device and the second high voltage level shifter device driven in the active state; wherein the high-side receiver circuit is configured to monitor a first difference between the first current flowing into the first high-side terminal of the first high voltage level shifter device and the second current flowing into the second high-side terminal of the second high voltage level shifter device; and wherein the low-side control circuit is configured to control a concomitant control terminal of the first control terminal and the second control terminal corresponding to the one of the first high voltage level shifter device and the second high voltage level shifter device driven in the active state in response to a second difference between the first current and the second current monitored flowing out of the first low-side terminal and the second low-side terminal.

In another example, this disclosure describes a method including: receiving, via a low-side control circuit of a high voltage level shifter, an input signal from a low-side low voltage domain; driving, by the low-side control circuit and in response to the received input signal, one of a first high voltage level shifter device and a second high voltage level shifter device to an active state while the other of the first high voltage level shifter device and the second high voltage level shifter device remains in an inactive state, wherein the first high voltage level shifter device includes a first high-side terminal, a first low-side terminal, and a first control terminal, wherein the first control terminal is configured to control a first current flowing into the first high-side terminal to the first low-side terminal, wherein the second high voltage level shifter device includes a second high-side terminal, a second low-side terminal, and a second control terminal, and wherein the second control terminal is configured to control a second current flowing into the second high-side terminal to the second low-side terminal; setting, by a high-side receiver circuit, a state of a high-side output signal in response to a monitored first difference between the first current flowing into the first high-side terminal of the first high voltage level shifter device and the second current flowing into the second high-side terminal of the second high voltage level shifter device; and controlling, by the low-side control circuit and in response to a second difference between the first current monitored flowing out of the first low side terminal and the second current monitored flowing out of the second low side terminal, a concomitant control terminal of the first control terminal and the second control terminal corresponding to the one of the first high voltage level shifter device and the second high voltage level shifter device driven in the active state.

In another example, this disclosure describes a high voltage level shifter configured to translate an input signal from a low-side low voltage domain to a high-side low voltage domain, the high voltage level shifter including: a first high voltage level shifter device, wherein the first high voltage level shifter device includes a first high-side terminal, a first low-side terminal, and a first control terminal, and wherein the first control terminal is configured to control a first current flowing into the first high-side terminal to the first low-side terminal; a second high voltage level shifter device, wherein the second high voltage level shifter device includes a second high-side terminal, a second low-side terminal, and a second control terminal, and wherein the second control terminal is configured to control a second current flowing into the second high-side terminal to the second low-side terminal; means for low-side control, wherein the means for low-side control is configured to drive the first control terminal and the second control terminal, wherein the means for low-side control is further configured to drive, in response to the input signal, one of the first high voltage level shifter device and the second high voltage level shifter device to an active state while the other of the first high voltage level shifter device and the second high voltage level shifter device remains in an inactive state; means for high-side receiving, wherein the means for high-side receiving is configured to set a state of a high-side output signal in response to the one of the first high voltage level shifter device and the second high voltage level shifter device driven in the active state; wherein the means for high-side receiving is configured to monitor a first difference between the first current flowing into the first high-side terminal of the first high voltage level shifter device and the second current flowing into the second high-side terminal of the second high voltage level shifter device; and wherein the means for low-side control is configured to control a concomitant control terminal of the first control terminal and the second control terminal corresponding to the one of the first high voltage level shifter device and the second high voltage level shifter device driven in the active state in response to a second difference between the first current monitored flowing out of the first low side terminal and the second current monitored flowing out of the second low side terminal.

The details of one or more examples of the techniques of this disclosure are set forth in the accompanying drawings and the description below. Other features, objects, and advantages of the techniques will be apparent from the description and drawings, and from the claims.

DETAILED DESCRIPTION

Techniques and circuit designs are disclosed for a high voltage level shifter that is configured to adjust current flow in response to measured current fluctuations due to common mode noise in the level shifter. For example, the level shifter may include a low-side control circuit configured to adjust a first current flowing into a first low-side terminal of an active high voltage level shifter device in response to a difference between the first current and a second current flowing into a second low-side terminal of an inactive high voltage level shifter device. The level shifter may further include a high-side receiver circuit configured detect a difference between a first output current flowing from a first high-side terminal of the active high voltage level shifter device driven in an active state and a second output current flowing from a second high-side terminal of the inactive high voltage level shifter device.

Typically, an electrical company provides mains voltage as an alternating current (AC) at a high voltage. A power converter within a consumer application is used to convert the supply into a lower voltage direct current (DC) before it is suitable for household or business use. In some examples, the mains voltage is a nominal supply voltage of 100-240 Volts (V) AC at 50-60 Hertz (Hz). In some examples, the power converter includes a power factor correction (PFC) circuit performs power factor correction on the nominal supply voltage and converts the nominal supply voltage to approximately 400 V direct current (DC). The power converter further includes an LLC resonant half-bridge converter circuit that converts the 400 VDC to approximately 400 VAC at 100-200 KHz. This, in turn, is passed through a transformer in the power converter to step down the supply to approximately 10-20 VAC. Finally, the 10-20 VAC is passed through a rectifier circuit in the power converter to convert the supply to a suitable low-level DC voltage for the end application. For example, the low-level DC voltage may be between 5-20 VDC, as is used by various components in consumer television applications.

Figure 1:
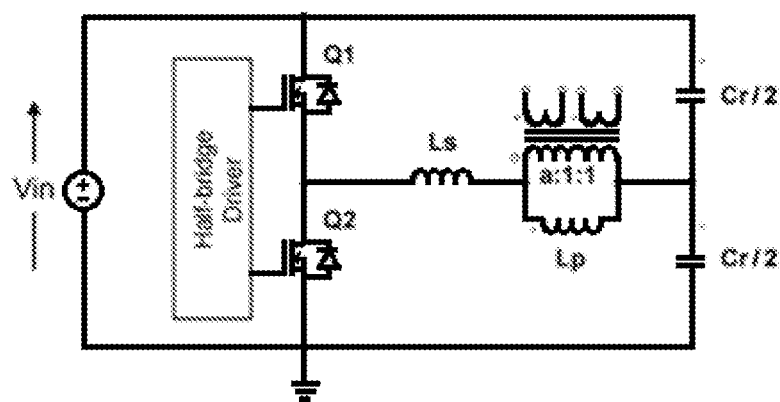
FIG. 1 is a block diagram illustrating an example LLC half-bridge resonator circuit.

The LLC resonant half-bridge converter circuit converts DC power into AC power. As illustrated by the example of FIG. 1, the LLC resonant half-bridge converter circuit operates by using a driver to switch two power transistors connected in series between the DC input voltage and ground on and off in opposing phase, such that each transistor is active for half of the duty cycle, and only while the other transistor is inactive. In response to commands from the driver circuit, the transistors generate a square wave at their output. One or more LLC tanks connected to the midpoint of the transistors undergo excitation in response to the square wave to create an AC sinusoidal output.

The LLC resonant half-bridge converter circuit typically provides a small dead-time between the turn-off of each transistor and the turn-on of the complementary transistor. The role of this dead-time ensures that each transistor does not cross-conduct, which, in high voltage applications, may damage the circuit.

Typically, a level shifter is used to implement the driver circuit of the LLC resonant half-bridge converter circuit. A level shifter functions to transfer input signals in one voltage domain into output signals in a different voltage domain. The input signals are connected to a ground in the low-side domain, while the output signals are connected to a ground in the high-side domain. Both the low-side ground and high-side ground are separate and electrically isolated from each other. For example, a level shifter may be used to convert control signals in a TTL voltage level (i.e., 3-5 VDC) to driver signals in a higher voltage domain, such as 10 VDC.

In ultra-high voltage applications, the voltage difference between the low voltage domain and the high voltage domain may be hundreds of Volts, and other level shifters may not provide suitable isolation between the domains. Isolation between the domains is important because the ground of the high-side domain is connected to the midpoint of the half-bridge. During normal operation of the level shifter, the midpoint of the half-bridge commutates between 0 V and 400 V at a slew rate of up to 10 V/nanosecond (ns). Further, because the slew rate, or change in voltage at the midpoint of the transistors, can be in the order of 10V/ nanosecond (ns), other level shifters may generate improper switching commands in response to these large changes in voltage. In some situations, rapid changes in common-mode voltage across the transistors may prevent a turn-off command from other level shifters from reaching a transistor. This may result in a shoot-through condition where both transistors are turned on, shorting the high voltage rail to ground. This may result in near-instantaneous destruction of the circuit. Furthermore, other types of common mode noise, such as ringing and electromagnetic interference (EMI) may prevent commands from other level shifters from reaching a transistor.

One approach to this problem involves coreless transformer technology, which transfers switching commands from a control circuit to a high side gate driver through an integrated planar microtransformer. However, this approach requires two separate chips isolated from each other, which leads to relatively high assembly cost.

According to the techniques of the disclosure, an ultra-high voltage level shifter is described which is more resistant to common-mode changes in voltage and noise than other level shifters. In one example, the level shifter includes a low-side control circuit configured to adjust a first current flowing into a first low-side terminal of an active high voltage level shifter device in response to a difference between the first current and a second current flowing into a second low-side terminal of an inactive high voltage level shifter device. The level shifter further includes a high-side receiver circuit configured detect a difference between a first output current flowing from a first high-side terminal of the active high voltage level shifter device driven in an active state and a second output current flowing from a second high-side terminal of the inactive high voltage level shifter device. Furthermore, the ultra-high voltage level shifter described herein may be implemented on a single monolithic integrated chip, which reduces both the production cost and package size of an ultra-high voltage level shifter.

Figure 2:
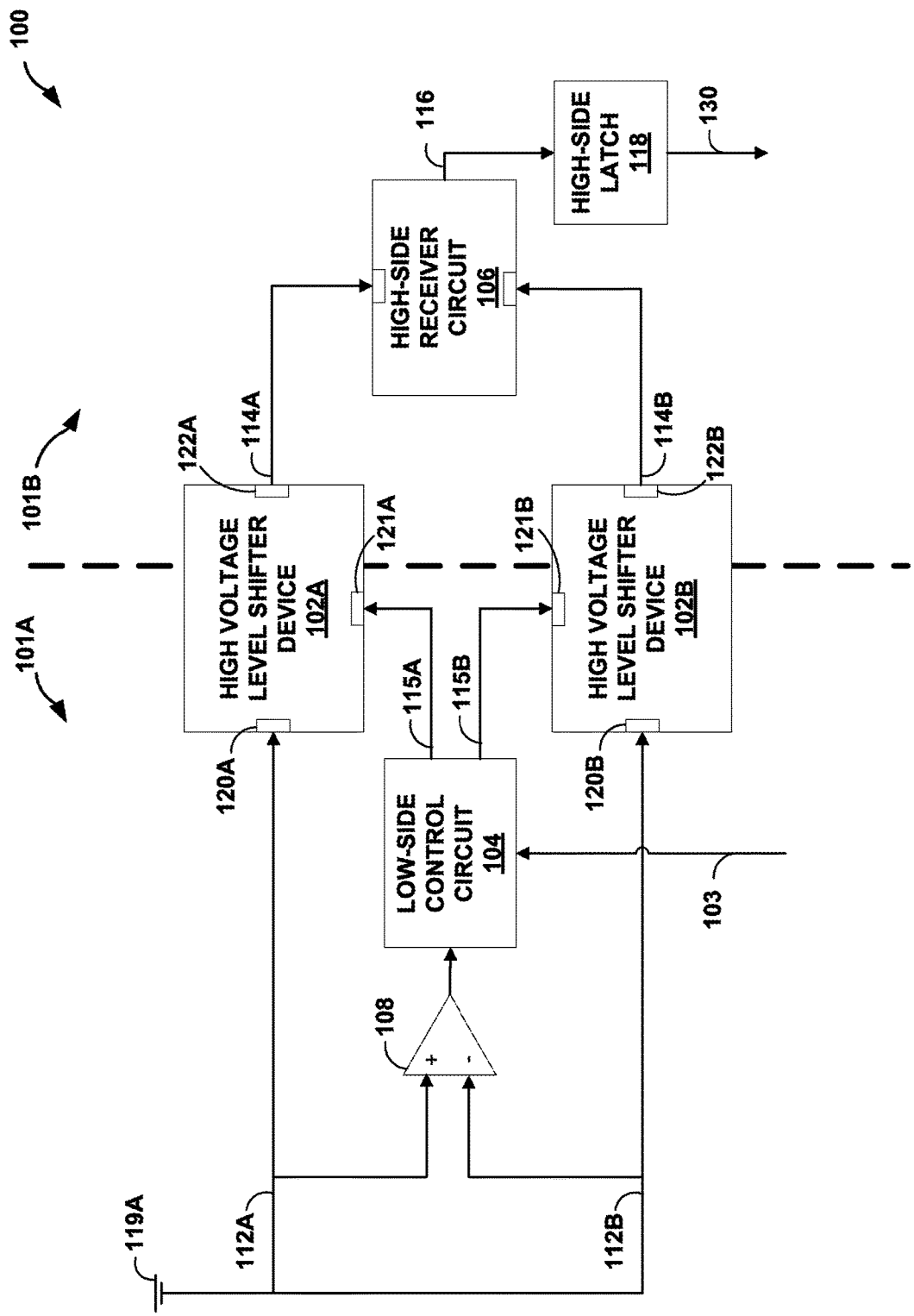
FIG. 2 is a block diagram illustrating an example high voltage level shifter according to the techniques of the disclosure.

FIG. 2 is a block diagram illustrating an example high voltage level shifter 100 configured to adjust a low-side current 112 or 114 of an active high voltage level shifter device 102 according to the techniques of the disclosure. In this example, high voltage level shifter 100 includes two high voltage level shifter devices 102A-102B ("collectively, high voltage level shifter devices 102") for converting voltage signals in low-side domain 101A to voltage signals in high-side domain 101B. A low-side control circuit 104 receives a low-side voltage domain input signal 103, which causes low-side control circuit 104 to drive one of high voltage level shifter devices 102 into an active state while driving the other of high voltage level shifter devices 102 into an inactive state. A high-side receiver circuit 106 receives high-side currents 114A-114B from high voltage level shifter devices 102, causing high-side receiver circuit 106 to output a signal 116 for setting a high-side latch 118 for defining the state of the high-side gate driver.

High voltage level shifter devices 102 include low-side terminals 120A-120B, each of which receives low-side currents 112A-112B, respectively, from low-side power supply 119A. High voltage level shifter devices 102 further include control terminals 121A-121B for receiving control signals 115A-115B from low-side control circuit 104. High voltage level shifter devices 102 further include high-side terminals 122A-122B for transmitting a high-side output current 114. In some examples, high voltage level shifter devices 102 include one or more power transistors. In another example, high voltage level shifter devices 102 include one of a lateral N-channel MOSFET or a cascode of a high voltage JFET, as well as a low voltage N-channel transistor. In response to a monitored difference between currents 112A-112B (collectively, "low-side currents 112"), low-side control circuit 104 adjusts a control signal 115A, 115B of the high voltage level shifter device 102 operating in the active state.

Low-side control circuit 104 receives a low-side voltage domain input signal 103. In response to input signal 103, low-side control circuit 104 generates control signals 115A-115B, which activate one of high voltage level shifter devices 102, while the other of high voltage level shifter devices 102 remains inactive.

High-side receiver circuit 106 receives high-side current signals 114A-114B from high-side terminals 122 of high voltage level shifter devices 102. In response to high-side current signals 114A-114B, high-side receiver circuit 106 generates an output signal 116 which sets the state of high-side latch 118. High-side latch 118 sets an output 130 of the level shifter circuit as a high-side voltage domain 101B equivalent to the state of input signal 103 of low-side voltage domain 101A. Output 130 controls operation of high side switch Q1 of FIG. 1.

According to the techniques of this disclosure, while one of high voltage level shifter devices 102 is active, low-side control circuit 104 monitors the low-side current 112 of the inactive high voltage level shifter device 102. As an example, low-side control circuit 104 drives high voltage level shifter device 102A into the active state and high voltage level shifter device 102B into the inactive state. Because high voltage level shifter device 102A is active, low-side current 112A is predicted to reach a target value. Further, because high voltage level shifter device 102B is inactive, low-side current 112B is expected to be approximately zero. Thus, the difference between low-side currents 112A and 112B is expected to be substantially the same as the predicted value of low-side current 112A while high voltage level shifter device 102A is active. Low-side control circuit 104 receives a signal from differential amplifier 108 indicative of the measured difference between low-side currents 112A and 112B. Due to fabrication tolerances, temperature dependency, and voltage dependency, low-side current 112A is unlikely to match the target value immediately after activation. By measuring the low-side current 112A via differential amplifier 108 and comparing it to the target value, low-side control circuit 104 adjusts control signal 115A until the low-side current 112A matches the target value.

In the presence of disturbances like noise, common mode voltage change, ringing or EMI, the low-side current 112A does not accurately indicate the current flowing through level shifter device 102A. Therefore, in other devices, the low-side control circuit 104, by monitoring only the low-side current 112A, may adjust control signal 115A to cause an incorrect level of current to flow through the level shifter device 102A. The techniques of the disclosure assume that the effect of disturbances such as noise, common mode voltage change, ringing, EMI, and the like is the same on both high voltage level shifter devices 102A and 102B. Therefore, in the presence of such disturbances, the low-side control circuit 104 monitors the difference between low-side currents 112A and 112B and adjusts the control signal 115A until the difference between low-side currents 112A and 112B matches a target value. In doing so, the current flowing through level shifter device 102A is regulated to the target value, even in the presence of such disturbances.

Furthermore, without the presence of these disturbances, the high-side current 114A is assumed to be equal to the low-side current 112A, while high-side current 114B is assumed to be equal to low-side current 112B. The presence of these disturbances causes high-side current 114A to differ from low-side current 112A and high-side current 114B to differ from low-side current 112B. The techniques of the disclosure assume that the difference of high-side current 114A and low-side current 112A on the active device 102A is the same as the difference of high-side current 114B and low-side current 112B on the inactive device 102B. Therefore, by measuring the difference of low-side current 112A and low-side current 112B via differential amplifier 108, and by using control signal 115A to adjust the difference between low-side current 112A and low-side current 112B to a target value via low-side control circuit 104, the difference between high-side current 114A and high-side current 114B may be controlled to match the target value, even in the presence of these disturbances. Finally, by monitoring the difference between high-side current 114A and high-side current 114B, high-side receiver circuit 106 may receive a signal undisturbed by noise, common mode voltage change, ringing, EMI, and the like.

Thus, a high voltage level shifter as described herein is expected to transmit signals that are insensitive to disturbances or noise in the circuit. This noise, if left unchecked, may induce false switching commands in high voltage level shifter devices 102 and high-side latch 118, or prevent switching commands from reaching high voltage level shifter device 102 or high-side latch 118 altogether. Accordingly, the high voltage level shifter as described herein may prevent damage to the half bridge due to noise due to common-mode voltage change, ringing, or EMI. Furthermore, the high voltage level shifter as described herein may continue to transfer control signals, even during large common mode voltage changes in the high-side circuit, without losing command signals. Thus, the high voltage level shifter 100 described herein may be more robust against higher levels of noise and common-mode voltage change than other level shifters.

The architecture of high voltage level shifter 100 illustrated in FIG. 2 is shown as an example. The techniques as set forth in this disclosure may be implemented in the example high voltage level shifter 100 of FIG. 2, as well as other types of high voltage level shifters not described specifically herein. Nothing in this disclosure should be construed so as to limit the techniques of this disclosure to the example architecture illustrated by FIG. 2.

Figure 3:
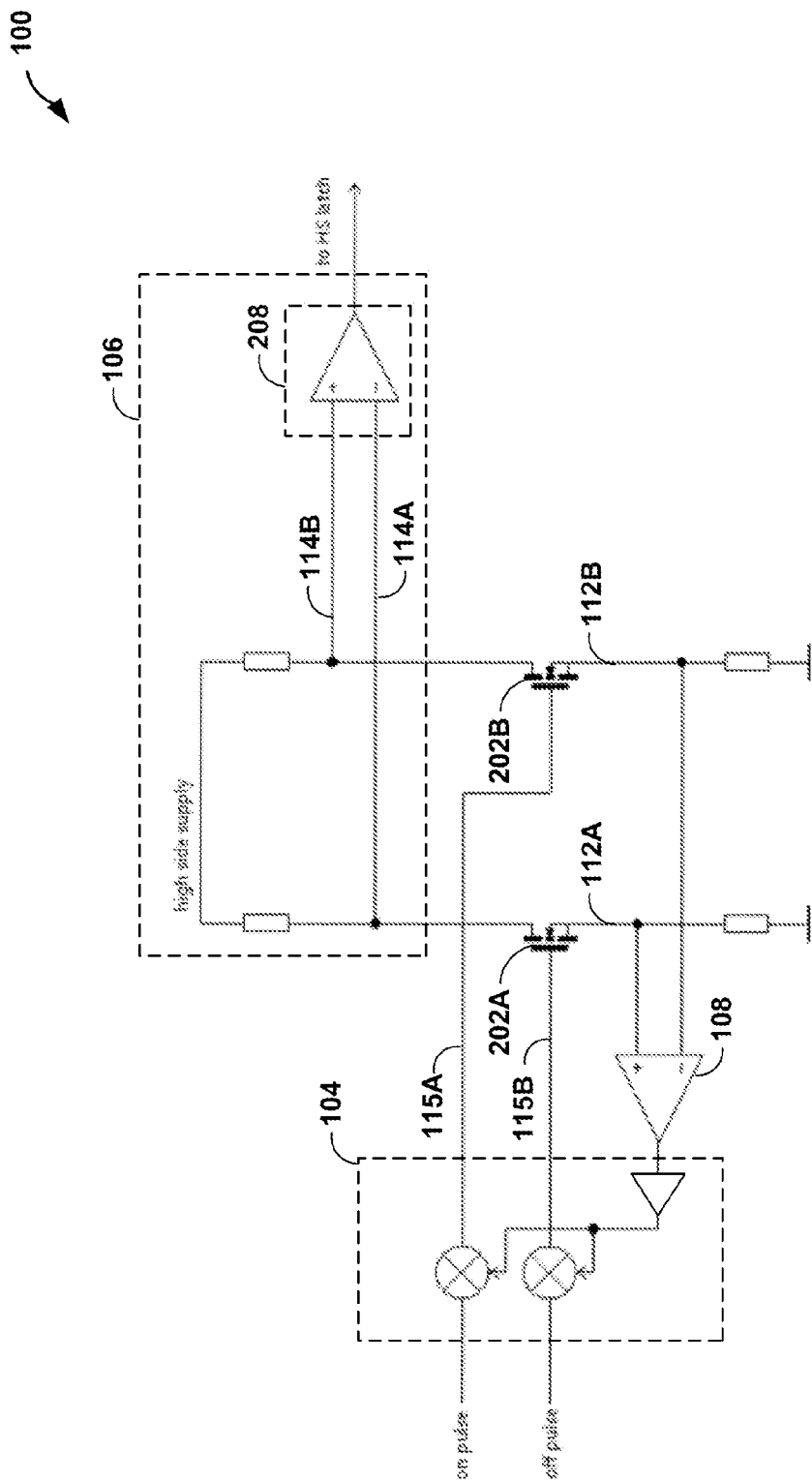
FIG. 3 is a circuit diagram illustrating in further detail an example high-side receiver circuit and a low side control circuit of the high voltage level shifter of FIG. 2 according to the techniques of the disclosure.

FIG. 3 is a circuit diagram illustrating in further detail an example low-side control circuit 104 and high-side receiver circuit 106 of the example high voltage level shifter 100 of FIG. 2 according to the techniques of the disclosure. In the example of FIG. 3, a low-side control circuit 104 senses, via differential amplifier 108, the difference between low-side current 112A and low-side current 112B. In response to the differential signal generated by differential amplifier 108, low-side control circuit 104 provides control signal 115A to adjust the difference between low-side current 112A and low-side current 112B to a target value. In doing so, low-side control circuit 104 controls the difference between high-side current 114A and high-side current 114B so as to match a target difference. Furthermore, a differential amplifier 208 of high-side receiver circuit 106 monitors a difference between high-side currents 114A of active transistor 202A and 124B of inactive transistor 202B. High-side receiver circuit 106 generates an output signal indicative of this difference which sets the state of high-side latch 118 (not depicted).

In some examples, transistors 202A-202B (collectively, "transistors 202") are ultra-high voltage power transistors.

In some examples, transistors 202 are capable of performing under voltages greater than 600 V. In some examples, transistors 202 are vertical bi-polar junction transistors (BJTs). In other examples, transistors 202 are vertical metal-oxide-semiconductor field effect transistors (MOSFETs). In some examples, transistors 202 are source-down or source-up transistors. In some examples, transistors 202 are lateral MOSFETs. In some examples, transistors 202 are lateral n-type channel MOSFETs built on a p-type substrate. In some examples, transistors 202 are lateral n-type channel MOSETs built on Silicon-on-Insulator (SOI) substrate. In some examples, transistors 202 are a cascode of an n-type channel junction-gate field effect transistor (JFET) in series with a low-voltage MOSFET. In some examples, transistors 202 are superjunction MOSFETs. In some examples, transistors 202 have high switching speed and low gate charge. In some examples, transistors 202 have low capacitance from drain to source and from drain to substrate.

In this way, high-side receiver circuit 106 may reduce or eliminate current flowing through the inactive MOSFET 102B due to noise or common-mode voltage change. This noise, if left unchecked, may induce false switching commands in high-side latch 118, or prevent switching commands from reaching high-side latch 118 altogether. Accordingly, high-side receiver circuit 106 may prevent damage to high voltage level shifter 100 due to noise due to common-mode voltage change, ringing, EMI. Furthermore, high-side receiver circuit 106 may continue to transfer signals, even during large common mode voltage changes in the high-side circuit, without losing command signals. Thus, the high voltage level shifter 100 described herein may be more robust against higher levels of noise and common-mode voltage change than other level shifters.

The architecture of high-side receiver circuit 106 illustrated in FIG. 3 is shown as an example only. The techniques as set forth in this disclosure may be implemented in the example high-side receiver circuit 106 of FIG. 3, as well as other types of high-side receiver circuits not described specifically herein. Nothing in this disclosure should be construed so as to limit the techniques of this disclosure to the example architecture illustrated by FIG. 3.

Figure 4:
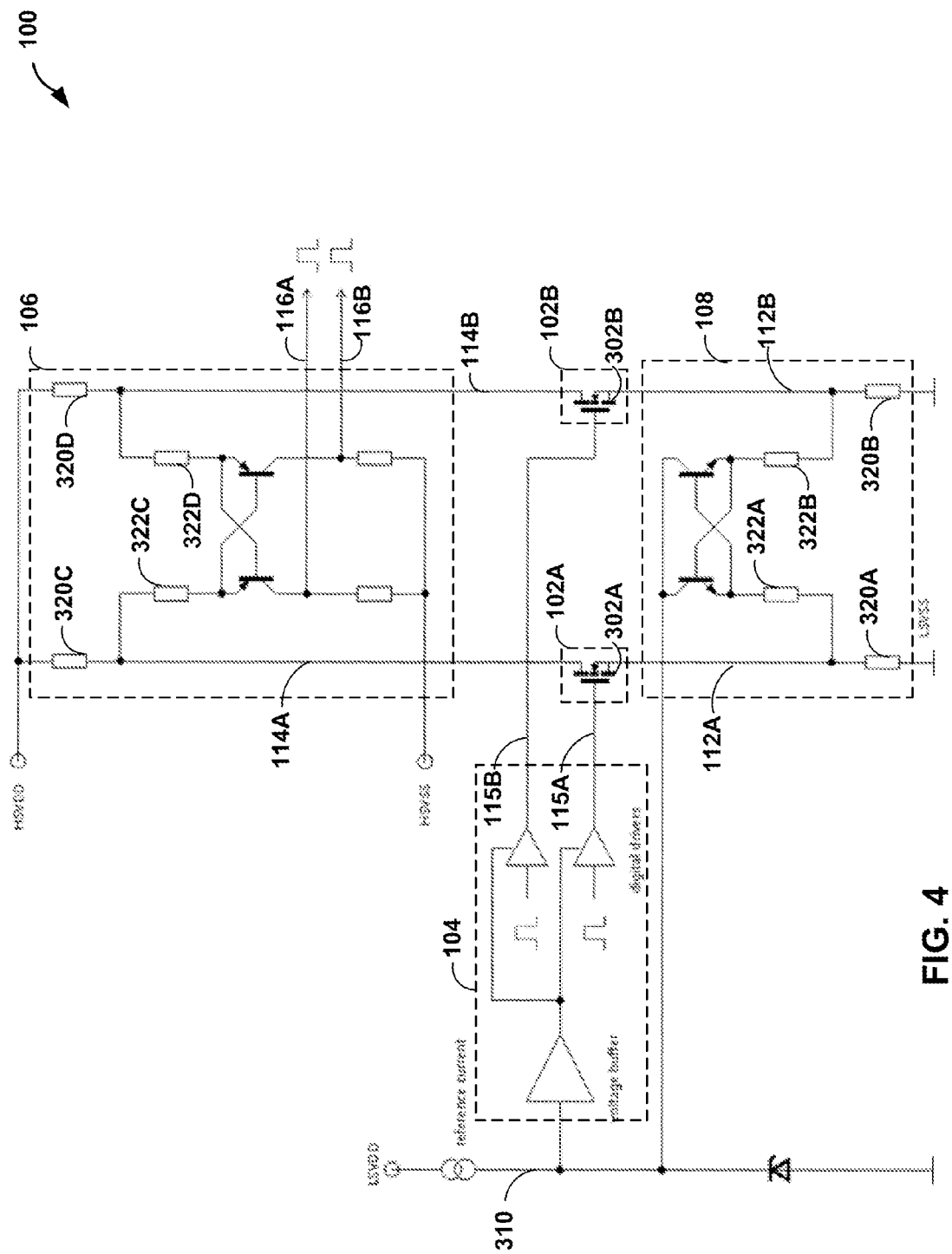
FIG. 4 is a circuit diagram illustrating in further detail the example high voltage level shifter of FIG. 2 according to the techniques of the disclosure.

FIG. 4 is a circuit diagram illustrating further details of an example high voltage level shifter according to the techniques of the disclosure. According to the techniques of the disclosure, in response to a monitored difference between currents 112A-112B flowing through transistors 302A-302B (collectively, "transistors 302"), low-side control circuit 104 adjusts the current 112A flowing through transistor 302A operating in the active state. Further, high-side receiver circuit 106 monitors a difference between currents 114A-114B and provides the difference as an output for setting a high-side latch 118 (not depicted) for defining the state of the high-side gate driver.

According to the techniques of the invention, while one of transistors 302 is active, low-side control circuit 104 monitors the low-side current 112 flowing through the inactive one of the transistors 302.

As an example, low-side control circuit 104 drives transistor 302A into the active state and transistor 302B into the inactive state. Because transistor 302A is active, low-side current 112A is predicted to reach a target value. Further, because transistor 302B is inactive, low-side current 112B is expected to be approximately zero. Thus, the difference between low-side currents 112A and 112B is expected to be substantially the same as the predicted value of low-side current 112A while high voltage level shifter device 102A is active. Due to fabrication tolerances, temperature dependency, and voltage dependency, low-side current 112A is unlikely to match the target value immediately after activation. By measuring the low-side current 112A via differential amplifier 108 and comparing it to the target value, low-side control circuit 104 adjusts control signal 115A until the low-side current 112A matches the target value.

In the presence of disturbances like noise, common mode voltage change, ringing or EMI, the low-side current 112A does not accurately indicate the current flowing through level shifter device 102A. Therefore, in other devices, the low-side control circuit 104, by monitoring only the low-side current 112A, may adjust control signal 115A to cause an incorrect level of current to flow through the level shifter device 102A. The techniques of the disclosure assume that the effect of disturbances such as noise, common mode voltage change, ringing, EMI, and the like is the same on both high voltage level shifter devices 102A and 102B. Therefore, in the presence of such disturbances, the low-side control circuit 104 monitors the difference between low-side currents 112A and 112B and adjusts the control signal 115A until the difference between low-side currents 112A and 112B matches a target value. In doing so, the current flowing through level shifter device 102A is regulated to the target value, even in the presence of such disturbances.

Furthermore, without the presence of these disturbances, the high-side current 114A is assumed to be equal to the low-side current 112A, while high-side current 114B is assumed to be equal to low-side current 112B. The presence of these disturbances causes high-side current 114A to differ from low-side current 112A and high-side current 114B to differ from low-side current 112B. The difference of high-side current 114A and low-side current 112A on the active device 102A is assumed to be the same as the difference of high-side current 114B and low-side current 112B on the inactive device 102B. Therefore, by measuring the difference of low-side current 112A and low-side current 112B via differential amplifier 108, and by using control signal 115A to adjust the difference between low-side current 112A and low-side current 112B to a target value via low-side control circuit 104, the difference between high-side current 114A and high-side current 114B may be controlled to match the target value, even in the presence of these disturbances. Finally, by monitoring the difference between high-side current 114A and high-side current 114B, high-side receiver circuit 106 may receive a signal undisturbed by noise, common mode voltage change, ringing, EMI, and the like.

Thus, a high voltage level shifter as described herein is expected to transmit signals that are insensitive to disturbances or noise in the circuit. This noise, if left unchecked, may induce false switching commands in high voltage level shifter devices 102 and high-side latch 118 (not depicted), or prevent switching commands from reaching high voltage level shifter device 102 or high-side latch 118 altogether. Accordingly, the high voltage level shifter as described herein may prevent damage to the half bridge due to noise due to common-mode voltage change, ringing, or EMI. Furthermore, the high voltage level shifter as described herein may continue to transfer control signals, even during large common mode voltage changes in the high-side circuit, without losing command signals. Thus, the high voltage level shifter 100 described herein may be more robust against higher levels of noise and common-mode voltage change than other level shifters.

In the example of FIG. 4, reference current 310 defines the target value. The collector current of the BJTs of differential amplifier 108 is a function of the difference of the currents 112A and 112B. The collector current is compared against the reference current 310. If the collector current is less, the greater current of the reference will pull up the input of low-side control circuit 104, leading to an increase of the gate voltage of the active one of the transistors 302. If the collector current is greater, it will pull down the input of low-side control circuit 104 against the reference current 310, leading to a decrease of the gate voltage of the active one of the transistors 302.

In some examples, each of low-side control circuit differential amplifier 108 and high-side receiver differential amplifier 106 include a first and second pair of current divider resistors 320 and 322. With respect to differential amplifier 108, each of the current sensing resistors (e.g., resistor 320A from 302A to ground and resistor 320B from 302B to ground) in relation to the each of the resistors in series with the bipolar transistors of differential amplifier 108 (e.g., resistors 322A and 322B) defines a current divider ratio. In some examples, this divider ratio is in the order from 2:1 to 10:1. In other words, the value of resistors 322 is two to ten times greater than the value of resistors 320. Therefore, the current flowing through the corresponding bipolar transistor is smaller than currents 112 and 114. Each of the current sensing resistors 320A-320B should have the same value (e.g., 1:1), while each of the resistors 322A and 322B in series with the bipolar transistors should have the same value (e.g., 1:1). Resistors 320C-320D and 322C-322D of high-side receiver differential amplifier 106 are configured in a similar fashion.

In some examples, differential amplifier 108 and high-side receiver circuit 106 include one or more vertical BJT transistors. Vertical BJTs may provide certain advantages over other types of transistors. For example, the voltage of the base/emitter complex of an NPN vertical BJT has no direct P-N junction to the substrate. Therefore, it can operate far below the substrate potential, which is ground or the low-side voltage rail. For example, the base/emitter complex of the PNP vertical BJT has no direct P-N junction to an N-well/N-buried layer region which isolates the high side circuit from the rest of the chip. Therefore, it can operate far above the high-side voltage rail, which is also the voltage level of the N-well/N-buried layer region. Therefore, the common mode range of the emitter/base regions of a vertical BJT may only be limited by the device breakdown voltage in one direction and the supply voltage in the other direction. Further, this value is much higher than the signal threshold for the differential signal, which is typically around 0.7V for BJTs.

In other examples, differential amplifier 108 and high-side receiver circuit 106 include one or more vertical MOSFETs. In some examples, the MOSFETs are DMOS transistors having a bulk connected to the source. Otherwise, providing a separate supply to the bulk may drastically reduce the common mode range. For example, the source/bulk region of the vertical MOSFETs included in the differential amplifier 108 have no direct P-N-junction to substrate and the source/bulk region of the vertical MOSFETs included in the high-side receiver circuit 106 have no direct P-N junction to the N-well/N-buried layer region which isolates the high side circuit from the rest of the chip.

High-side receiver circuit 106 receives high-side current signals 114A-114B and generates output signals 116A-116B which sets the state of high-side latch 118 of FIG. 1 (not depicted). High-side latch 118 sets an output which controls operation of high side switch Q1 of FIG. 1.

In one example, differential amplifier 108 includes a first low-side cross-coupled device and a second low-side cross-coupled device, each having a control terminal, an output terminal, and a common or ground terminal. In some examples, the first and second cross-coupled devices are transistors having an emitter, a base, and a collector terminal. In an example configuration, the common terminal of the first low-side cross-coupled device is connected to the control terminal of the second low-side cross-coupled device 102A and the first low-side terminal of the first high voltage level shifter device. Further, the common terminal of the second low-side cross-coupled device is connected to the control terminal of the first low-side cross-coupled device and the second low-side terminal of the second high voltage level shifter device 102B.

In another example, high-side receiver circuit 106 includes a first high-side cross-coupled device and a second high-side cross coupled device, each having a control terminal, an output terminal, and a common or ground terminal. In some examples, the first and second cross-coupled devices are transistors having an emitter, a base, and a collector terminal. In an example configuration, the common terminal of the first high-side cross-coupled device is connected to the control terminal of the second high-side cross-coupled device and to the first high-side terminal of the first high voltage level shifter device 102A. Further, the common terminal of the second high-side cross-coupled device is connected to the control terminal of the first high-side cross-coupled device and to the second high-side terminal of the second high voltage level shifter device 102B.

According to the techniques of this disclosure, while one of high voltage level shifter devices 102 is active, low-side control circuit 104 monitors the low-side current 112 of the inactive high voltage level shifter device 102. As an example, low-side control circuit 104 drives transistor 302A into the active state and transistor 302B into the inactive state. Because transistor 302A is active, low-side current 112A is predicted to reach a target value. Further, because transistor 302B is inactive, low-side current 112B is expected to be approximately zero. Thus, the difference between low-side currents 112A and 112B is expected to be substantially the same as the predicted value of low-side current 112A while transistor 302A is active. Low-side control circuit 104 receives a signal from differential amplifier 108 indicative of the measured difference between low-side currents 112A and 112B. Due to fabrication tolerances, temperature dependency, and voltage dependency, low-side current 112A is unlikely to match the target value immediately after activation. By measuring the low-side current 112A via differential amplifier 108 and comparing it to the target value, low-side control circuit 104 adjusts control signal 115A until the low-side current 112A matches the target value.

In the presence of disturbances like noise, common mode voltage change, ringing or EMI, the low-side current 112A does not accurately indicate the current flowing through transistor 302A. Therefore, in other devices, the low-side control circuit 104, by monitoring only the low-side current 112A, may adjust control signal 115A to cause an incorrect level of current to flow through transistor 302A. The techniques of the disclosure assume that the effect of disturbances such as noise, common mode voltage change, ringing, EMI, and the like is the same on both high voltage level shifter devices 102A and 102B. Therefore, in the presence of such disturbances, the low-side control circuit 104 monitors the difference between low-side currents 112A and 112B and adjusts the control signal 115A until the difference between low-side currents 112A and 112B matches a target value. In doing so, the current flowing through transistor 302A is regulated to the target value, even in the presence of such disturbances.

Furthermore, without the presence of these disturbances, the high-side current 114A is assumed to be equal to the low-side current 112A, while high-side current 114B is assumed to be equal to low-side current 112B. The presence of these disturbances causes high-side current 114A to differ from low-side current 112A and high-side current 114B to differ from low-side current 112B. The difference of high-side current 114A and low-side current 112A on the active device 102A is assumed to be the same as the difference of high-side current 114B and low-side current 112B on the inactive device 102B. Therefore, by measuring the difference of low-side current 112A and low-side current 112B via differential amplifier 108, and by using control signal 115A to adjust the difference between low-side current 112A and low-side current 112B to a target value via low-side control circuit 104, the difference between high-side current 114A and high-side current 114B may be controlled to match the target value, even in the presence of these disturbances. Finally, by monitoring the difference between high-side current 114A and high-side current 114B, high-side receiver circuit 106 may receive a signal undisturbed by noise, common mode voltage change, ringing, EMI, and the like.

Thus, a high voltage level shifter as described herein is expected to transmit signals that are insensitive to disturbances or noise in the circuit. This noise, if left unchecked, may induce false switching commands in high voltage level shifter devices 102 and high-side latch 118, or prevent switching commands from reaching high voltage level shifter device 102 or high-side latch 118 altogether. Accordingly, the high voltage level shifter as described herein may prevent damage to the half bridge due to noise due to common-mode voltage change, ringing, or EMI. Furthermore, the high voltage level shifter as described herein may continue to transfer control signals, even during large common mode voltage changes in the high-side circuit, without losing command signals. Thus, the high voltage level shifter 100 described herein may be more robust against higher levels of noise and common-mode voltage change than other level shifters.

In some examples, low-side control circuit 104 is edge sensitive. In other examples, an edge detection circuit is located upstream of low-side control circuit 104, as depicted in the example of FIG. 4. While the input signal 112 is static, both high voltage level shifter devices 102 are in an inactive state. Only when low-side control circuit 104 detects a signal edge on the input 112, does the edge detection circuit generate a short pulse, either on the input controlling the gate of transistor 302A (e.g., the buffer generating current 115A of FIG. 4) or on the input controlling the gate of transistor 302B (e.g. the buffer generating current 115B of FIG. 4). It should be noted that directly coupling input signals 112 without edge detection to the gates of transistors 302 would theoretically work. However, the power dissipation required may exceed the capability of transistors 302 if static current flows through one of transistors 302. High side latch 118 is only needed if edge detection is used on the low-side circuit to store the last pulse of low-side control circuit 104 while the input is static and none of high voltage level shifter devices 102 or transistors 302 is active.

The architecture of high voltage level shifter 100 illustrated in FIG. 4 is shown as an example. The techniques as set forth in this disclosure may be implemented in the example high voltage level shifter 100 of FIG. 4, as well as other types of high voltage level shifters not described specifically herein. Nothing in this disclosure should be construed so as to limit the techniques of this disclosure to the example architecture illustrated by FIG. 4.

Figure 5:
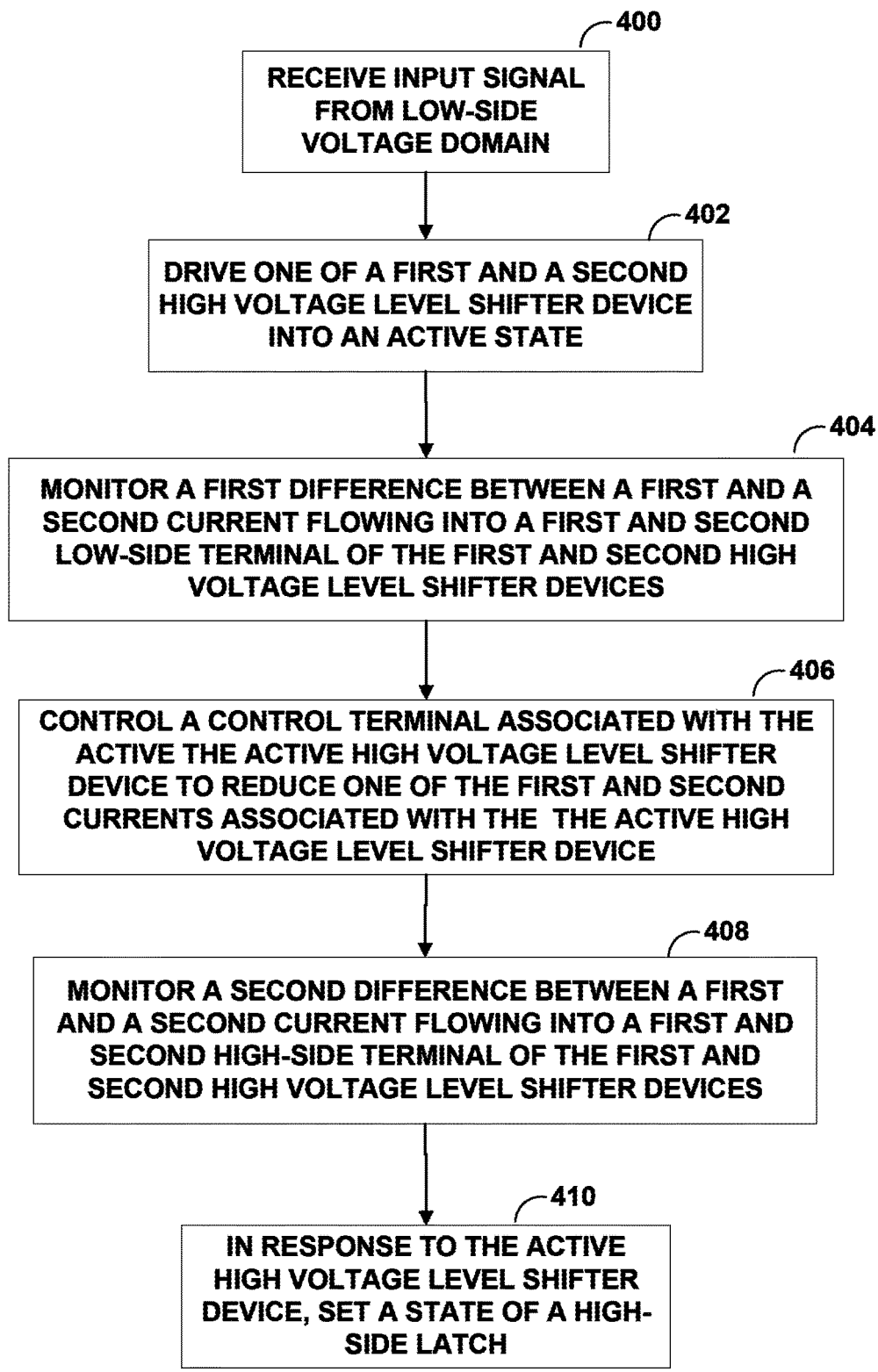
FIG. 5 is a flowchart illustrating an example operation of a high voltage level shifter according to the techniques of the disclosure.

FIG. 5 is a flowchart illustrating an example operation of a high voltage level shifter according to the techniques of the disclosure. For convenience, FIG. 5 is described with respect to FIG. 2 although other circuits may be used to implement the techniques.

As shown in the example of FIG. 5, low-side control circuit 106 receives an input signal 103 from a low-side voltage domain (400). In response to the input signal 103, low-side control circuit 106 drives one of high voltage level shifter devices 102 into an active state while driving the other of high voltage level shifter devices 102 into an inactive state (402).

While one of high voltage level shifter devices 102 is active, low-side control circuit 104 monitors the low-side current 112 of the inactive high voltage level shifter device 102 (404). Because high voltage level shifter device 102A is active, low-side current 112A is predicted to reach a target value. Further, because high voltage level shifter device 102B is inactive, low-side current 112B is expected to be approximately zero. Thus, the difference between low-side currents 112A and 112B is expected to be substantially the same as the predicted value of low-side current 112A while high voltage level shifter device 102A is active. Low-side control circuit 104 receives a signal from differential amplifier 108 indicative of the measured difference between low-side currents 112A and 112B. Due to fabrication tolerances, temperature dependency, and voltage dependency, low-side current 112A is unlikely to match the target value immediately after activation. By measuring the low-side current 112A via differential amplifier 108 and comparing it to the target value, low-side control circuit 104 adjusts control signal 115A until the low-side current 112A matches the target value (406). Low-side control circuit 104 continuously monitors the low-side current 112 of the inactive high voltage level shifter device 102 (404) and adjusts control signals 115 until the low-side current 112A matches the target value (406) while one of the high voltage level shifter devices 102 is active.

In the presence of disturbances like noise, common mode voltage change, ringing or EMI, the low-side current 112A does not accurately indicate the current flowing through level shifter device 102A. Therefore, in other devices, the low-side control circuit 104, by monitoring only the low-side current 112A, may adjust control signal 115A to cause an incorrect level of current to flow through the level shifter device 102A. The techniques of the disclosure assume that the effect of disturbances such as noise, common mode voltage change, ringing, EMI, and the like is the same on both high voltage level shifter devices 102A and 102B. Therefore, in the presence of such disturbances, the low-side control circuit 104 monitors the difference between low-side currents 112A and 112B and adjusts the control signal 115A until the difference between low-side currents 112A and 112B matches a target value. In doing so, the current flowing through level shifter device 102A is regulated to the target value, even in the presence of such disturbances.

In parallel to low-side control circuit 104 monitoring the low-side current 112 and adjusting control signals 115, high-side receiver circuit 106 monitors a difference between high-side output currents 114A and 114B (408). In response to high-side current signals 114A-114B, high-side receiver circuit 106 generates an output signal 116 which sets the state of high-side latch 118. High-side latch 118 sets an output 130 of the level shifter circuit as a high-side voltage domain 101B equivalent to the state of input signal 103 of low-side voltage domain 101A. Output 130 controls operation of high side switch Q1 of FIG. 1 (410).

Without the presence of disturbances in the current, the high-side current 114A is assumed to be equal to the low-side current 112A, while high-side current 114B is assumed to be equal to low-side current 112B. The presence of these disturbances causes high-side current 114A to differ from low-side current 112A and high-side current 114B to differ from low-side current 112B. The techniques of the disclosure assume that the difference of high-side current 114A and low-side current 112A on the active device is the same as the difference of high-side current 114B and low-side current 112B on the inactive device 102B. Therefore, by measuring the difference of low-side current 112A and low-side current 112B via differential amplifier 108, and by using control signal 115A to adjust the difference between low-side current 112A and low-side current 112B to a target value via low-side control circuit 104, the difference between high-side current 114A and high-side current 114B may be controlled to match the target value, even in the presence of these disturbances. Finally, by monitoring the difference between high-side current 114A and high-side current 114B, high-side receiver circuit 106 may receive a signal undisturbed by noise, common mode voltage change, ringing, EMI, and the like.

Thus, a high voltage level shifter as described herein is expected to transmit signals that are insensitive to disturbances or noise in the circuit. This noise, if left unchecked, may induce false switching commands in high voltage level shifter devices 102 and high-side latch 118, or prevent switching commands from reaching high voltage level shifter device 102 or high-side latch 118 altogether. Accordingly, the high voltage level shifter as described herein may prevent damage to the half bridge due to noise due to common-mode voltage change, ringing, or EMI. Furthermore, the high voltage level shifter as described herein may continue to transfer control signals, even during large common mode voltage changes in the high-side circuit, without losing command signals. Thus, the high voltage level shifter 100 described herein may be more robust against higher levels of noise and common-mode voltage change than other level shifters.

The operation of high voltage level shifter 100 illustrated in FIG. 5 is shown as an example. The techniques as set forth in this disclosure may be implemented in the example operation of FIG. 5, as well as other operations not described specifically herein. Nothing in this disclosure should be construed so as to limit the techniques of this disclosure to the example operation illustrated by FIG. 5.

The following examples may illustrate one or more aspects of the disclosure.

Example 1

A high voltage level shifter configured to translate an input signal from a low-side low voltage domain to a high-side low voltage domain, the high voltage level shifter comprising: a first high voltage level shifter device, wherein the first high voltage level shifter device comprises a first high-side terminal, a first low-side terminal, and a first control terminal, and wherein the first control terminal is configured to control a first current flowing into the first high-side terminal to the first low-side terminal; a second high voltage level shifter device, wherein the second high voltage level shifter device comprises a second high-side terminal, a second low-side terminal, and a second control terminal, and wherein the second control terminal is configured to control a second current flowing into the second high-side terminal to the second low-side terminal; a low-side control circuit configured to drive the first control terminal and the second control terminal, wherein the low-side control circuit is further configured to drive, in response to the input signal, one of the first high voltage level shifter device and the second high voltage level shifter device to an active state while the other of the first high voltage level shifter device and the second high voltage level shifter device remains in an inactive state; a high-side receiver circuit configured to set a state of a high-side output signal in response to the one of the first high voltage level shifter device and the second high voltage level shifter device driven in the active state; wherein the high-side receiver circuit is configured to monitor a first difference between the first current flowing into the first high-side terminal of the first high voltage level shifter device and the second current flowing into the second high-side terminal of the second high voltage level shifter device; and wherein the low-side control circuit is configured to control a concomitant control terminal of the first control terminal and the second control terminal corresponding to the one of the first high voltage level shifter device and the second high voltage level shifter device driven in the active state in response to a second difference between the first current and the second current monitored flowing out of the first low-side terminal and the second low-side terminal.

Example 2

The high voltage level shifter of example 1, wherein each of the low-side low voltage domain and the high-side low voltage domain comprises a positive rail and a negative rail; the first high-side terminal of the first high voltage level shifter device is connected to the positive rail of the high-side domain via a first high-side current sensing device; the second high-side terminal of the second high voltage level shifter device is connected to the positive rail of the high-side domain via a second high-side current sensing device; the first low-side terminal of the first high voltage level shifter device is connected to the negative rail of the low-side domain via a first low-side current sensing device; and the second low-side terminal of the second high voltage level shifter device is connected to the negative rail of the low-side domain through a second low-side current sensing device.

Example 3

The high voltage level shifter of any of examples 1-2, wherein each of the first high-side current sensing device and the second high-side current sensing device comprise a resistor of a first value; wherein each of the first low-side current sensing device and the second low-side current sensing device comprise a resistor of a second value; and wherein the first value and the second value have a predetermined ratio.

Example 4

The high voltage level shifter of any of examples 1-3, wherein the predetermined ratio is substantially equal to 1.

Example 5

The high voltage level shifter of any of examples 1-4, wherein the high-side receiver circuit comprises a first high-side cross-coupled device and a second high-side cross-coupled device, wherein each of the first high-side cross-coupled device and the second high-side cross-coupled device comprises: a control terminal; an output terminal; and a common terminal; wherein the common terminal of the first high-side cross-coupled device is connected to the control terminal of the second high-side cross-coupled device and the first high-side terminal of the first high voltage level shifter device; and wherein the common terminal of the second high-side cross-coupled device is connected to the control terminal of the first high-side cross-coupled device and the second high-side terminal of the second high voltage level shifter device.

Example 6

The high voltage level shifter of any of examples 1-5, wherein the low-side control circuit comprises a first low-side cross-coupled device and a second cross-coupled device, wherein each of the first low-side cross-coupled device and the second cross-coupled device comprise: a control terminal; an output terminal; and a common terminal; wherein the common terminal of the first low-side cross-coupled device is connected to the control terminal of the second low-side cross-coupled device and to the first low-side terminal of the first high voltage level shifter device; and wherein the common terminal of the second low-side cross-coupled device is connected to the control terminal of the first low-side cross-coupled device and to the second low-side terminal of the second high voltage level shifter device.

Example 7

The high voltage level shifter of any of examples 1-6, wherein a monolithic integrated circuit comprises the high voltage level shifter, and wherein the high-side receiver circuit is isolated from a substrate of the monolithic integrated circuit by an n-doped well connected to the positive rail of the high-side domain.

Example 8

The high voltage level shifter of any of examples 1-7, wherein each of the first high-side cross-coupled device and the second high-side cross-coupled device is a vertical bipolar transistor; wherein each corresponding control terminal of the first high-side cross-coupled device and the second high-side cross-coupled device is a base terminal of the vertical bipolar transistor; wherein each corresponding common terminal of the first high-side cross-coupled device and the second high-side cross-coupled device is an emitter terminal of the vertical bipolar transistor; wherein each corresponding output terminal of the first high-side cross-coupled device and the second high-side cross-coupled device is a collector terminal of the vertical bipolar transistor; and wherein each of an emitter region and a base region of the vertical bipolar transistor has no direct PN junction to the n-doped well.

Example 9

The high voltage level shifter of any of examples 1-8, wherein each of the first high-side cross-coupled device and the second high-side cross-coupled device is a vertical MOS transistor; wherein each corresponding control terminal of the first high-side cross-coupled device and the second high-side cross-coupled device is a gate terminal of the vertical MOS transistor; wherein each corresponding common terminal of the first high-side cross-coupled device and the second high-side cross-coupled device is a source terminal of the vertical MOS transistor; wherein each corresponding output terminal of the first high-side cross-coupled device and the second high-side cross-coupled device is a drain terminal of the vertical MOS transistor; and wherein a source region of the vertical MOS transistor has no direct PN junction to the n-doped well.

Example 10

A method comprising: receiving, via a low-side control circuit of a high voltage level shifter, an input signal from a low-side low voltage domain; driving, by the low-side control circuit and in response to the received input signal, one of a first high voltage level shifter device and a second high voltage level shifter device to an active state while the other of the first high voltage level shifter device and the second high voltage level shifter device remains in an inactive state, wherein the first high voltage level shifter device comprises a first high-side terminal, a first low-side terminal, and a first control terminal, wherein the first control terminal is configured to control a first current flowing into the first high-side terminal to the first low-side terminal, wherein the second high voltage level shifter device comprises a second high-side terminal, a second low-side terminal, and a second control terminal, and wherein the second control terminal is configured to control a second current flowing into the second high-side terminal to the second low-side terminal; setting, by a high-side receiver circuit, a state of a high-side output signal in response to a monitored first difference between the first current flowing into the first high-side terminal of the first high voltage level shifter device and the second current flowing into the second high-side terminal of the second high voltage level shifter device; and controlling, by the low-side control circuit and in response to a second difference between the first current monitored flowing out of the first low side terminal and the second current monitored flowing out of the second low side terminal, a concomitant control terminal of the first control terminal and the second control terminal corresponding to the one of the first high voltage level shifter device and the second high voltage level shifter device driven in the active state.

Example 11

The method of example 10, wherein each of the low-side low voltage domain and the high-side low voltage domain comprises a positive rail and a negative rail; the first high-side terminal of the first high voltage level shifter device is connected to the positive rail of the high-side domain via a first high-side current sensing device; the second high-side terminal of the second high voltage level shifter device is connected to the positive rail of the high-side domain via a second high-side current sensing device; the first low-side terminal of the first high voltage level shifter device is connected to the negative rail of the low-side domain via a first low-side current sensing device; and the second low-side terminal of the second high voltage level shifter device is connected to the negative rail of the low-side domain through a second low-side current sensing device.

Example 12

The method of any of examples 10-11, wherein each of the first high-side current sensing device and the second high-side current sensing device comprise a resistor of a first value; wherein each of the first low-side current sensing device and the second low-side current sensing device comprise a resistor of a second value; and wherein the first value and the second value have a predetermined ratio.

Example 13

The method of any of examples 10-12, wherein the predetermined ratio is substantially equal to 1.

Example 14

The method of any of examples 10-13, wherein the high-side receiver circuit comprises a first high-side cross-coupled device and a second high-side cross-coupled device, wherein each of the first high-side cross-coupled device and the second high-side cross-coupled device comprises: a control terminal; an output terminal; and a common terminal; wherein the common terminal of the first high-side cross-coupled device is connected to the control terminal of the second high-side cross-coupled device and the first high-side terminal of the first high voltage level shifter device; and wherein the common terminal of the second high-side cross-coupled device is connected to the control terminal of the first high-side cross-coupled device and the second high-side terminal of the second high voltage level shifter device.

Example 15

The method of any of examples 10-14, wherein the low-side control circuit comprises a first low-side cross-coupled device and a second cross-coupled device, wherein each of the first low-side cross-coupled device and the second cross-coupled device comprise: a control terminal; an output terminal; and a common terminal; wherein the common terminal of the first low-side cross-coupled device is connected to the control terminal of the second low-side cross-coupled device and to the first low-side terminal of the first high voltage level shifter device; and wherein the common terminal of the second low-side cross-coupled device is connected to the control terminal of the first low-side cross-coupled device and to the second low-side terminal of the second high voltage level shifter device.

Example 16

The method of any of examples 10-15, wherein a monolithic integrated circuit comprises the high voltage level shifter, and wherein the high-side receiver circuit is isolated from a substrate of the monolithic integrated circuit by an n-doped well connected to the positive rail of the high-side domain.

Example 17

The method of any of examples 10-17, wherein each of the first high-side cross-coupled device and the second high-side cross-coupled device is a vertical bipolar transistor; wherein each corresponding control terminal of the first high-side cross-coupled device and the second high-side cross-coupled device is a base terminal of the vertical bipolar transistor; wherein each corresponding common terminal of the first high-side cross-coupled device and the second high-side cross-coupled device is an emitter terminal of the vertical bipolar transistor; wherein each corresponding output terminal of the first high-side cross-coupled device and the second high-side cross-coupled device is a collector terminal of the vertical bipolar transistor; and wherein each of an emitter region and a base region of the vertical bipolar transistor has no direct PN junction to the n-doped well.

Example 18

The method of any of examples 10-17, wherein each of the first high-side cross-coupled device and the second high-side cross-coupled device is a vertical MOS transistor; wherein each corresponding control terminal of the first high-side cross-coupled device and the second high-side cross-coupled device is a gate terminal of the vertical MOS transistor; wherein each corresponding common terminal of the first high-side cross-coupled device and the second high-side cross-coupled device is a source terminal of the vertical MOS transistor; wherein each corresponding output terminal of the first high-side cross-coupled device and the second high-side cross-coupled device is a drain terminal of the vertical MOS transistor; and wherein a source region of the vertical MOS transistor has no direct PN junction to the n-doped well.

Example 19

A high voltage level shifter configured to translate an input signal from a low-side low voltage domain to a high-side low voltage domain, the high voltage level shifter comprising: a first high voltage level shifter device, wherein the first high voltage level shifter device comprises a first high-side terminal, a first low-side terminal, and a first control terminal, and wherein the first control terminal is configured to control a first current flowing into the first high-side terminal to the first low-side terminal; a second high voltage level shifter device, wherein the second high voltage level shifter device comprises a second high-side terminal, a second low-side terminal, and a second control terminal, and wherein the second control terminal is configured to control a second current flowing into the second high-side terminal to the second low-side terminal; means for low-side control, wherein the means for low-side control is configured to drive the first control terminal and the second control terminal, wherein the means for low-side control is further configured to drive, in response to the input signal, one of the first high voltage level shifter device and the second high voltage level shifter device to an active state while the other of the first high voltage level shifter device and the second high voltage level shifter device remains in an inactive state; means for high-side receiving, wherein the means for high-side receiving is configured to set a state of a high-side output signal in response to the one of the first high voltage level shifter device and the second high voltage level shifter device driven in the active state; wherein the means for high-side receiving is configured to monitor a first difference between the first current flowing into the first high-side terminal of the first high voltage level shifter device and the second current flowing into the second high-side terminal of the second high voltage level shifter device; and wherein the means for low-side control is configured to control a concomitant control terminal of the first control terminal and the second control terminal corresponding to the one of the first high voltage level shifter device and the second high voltage level shifter device driven in the active state in response to a second difference between the first current monitored flowing out of the first low side terminal and the second current monitored flowing out of the second low side terminal.

Example 20

The high voltage level shifter of example 19, wherein each of the low-side low voltage domain and the high-side low voltage domain comprises a positive rail and a negative rail; the first high-side terminal of the first high voltage level shifter device is connected to the positive rail of the high-side domain via a first high-side current sensing device; the second high-side terminal of the second high voltage level shifter device is connected to the positive rail of the high-side domain via a second high-side current sensing device; the first low-side terminal of the first high voltage level shifter device is connected to the negative rail of the low-side domain via a first low-side current sensing device; and the second low-side terminal of the second high voltage level shifter device is connected to the negative rail of the low-side domain through a second low-side current sensing device.

The techniques described in this disclosure may be implemented within the same device or within separate devices to support the various operations and functions described in this disclosure. In addition, any of the described units, modules, or components may be implemented together or separately as discrete but interoperable components. Depiction of different features as modules or units is intended to highlight different functional aspects and does not necessarily imply that such modules or units must be realized by separate hardware components. Rather, functionality associated with one or more modules or units may be performed by separate hardware components, or integrated within common or separate hardware components.

Various examples have been described. These and other examples are within the scope of the following claims.

What is claimed is:

1. A high voltage level shifter configured to translate an input signal from a low-side low voltage domain to a high-side low voltage domain, the high voltage level shifter comprising:
a first high voltage level shifter device, wherein the first high voltage level shifter device comprises a first high-side terminal, a first low-side terminal, and a first control terminal, and wherein the first control terminal is configured to control a first current flowing into the first high-side terminal to the first low-side terminal;
a second high voltage level shifter device, wherein the second high voltage level shifter device comprises a second high-side terminal, a second low-side terminal, and a second control terminal, and wherein the second control terminal is configured to control a second current flowing into the second high-side terminal to the second low-side terminal;
a low-side control circuit configured to drive the first control terminal and the second control terminal, wherein the low-side control circuit is further configured to drive, in response to the input signal, one of the first high voltage level shifter device and the second high voltage level shifter device to an active state while the other of the first high voltage level shifter device and the second high voltage level shifter device remains in an inactive state;
a high-side receiver circuit configured to set a state of a high-side output signal in response to the one of the first high voltage level shifter device and the second high voltage level shifter device driven in the active state;

wherein the high-side receiver circuit is configured to monitor a first difference between the first current flowing into the first high-side terminal of the first high voltage level shifter device and the second current flowing into the second high-side terminal of the second high voltage level shifter device; and wherein the low-side control circuit is configured to control a concomitant control terminal of the first control terminal and the second control terminal corresponding to the one of the first high voltage level shifter device and the second high voltage level shifter device driven in the active state in response to a second difference between the first current and the second current monitored flowing out of the first low-side terminal and the second low-side terminal.

2. The high voltage level shifter of claim 1, wherein each of the low-side low voltage domain and the high-side low voltage domain comprises a positive rail and a negative rail;

the first high-side terminal of the first high voltage level shifter device is connected to the positive rail of the high-side domain via a first high-side current sensing device;

the second high-side terminal of the second high voltage level shifter device is connected to the positive rail of the high-side domain via a second high-side current sensing device;

the first low-side terminal of the first high voltage level shifter device is connected to the negative rail of the low-side domain via a first low-side current sensing device; and the second low-side terminal of the second high voltage level shifter device is connected to the negative rail of the low-side domain through a second low-side current sensing device.

3. The high voltage level shifter of claim 2, wherein each of the first high-side current sensing device and the second high-side current sensing device comprise a resistor of a first value;

wherein each of the first low-side current sensing device and the second low-side current sensing device comprise a resistor of a second value; and wherein the first value and the second value have a predetermined ratio.

4. The high voltage level shifter of claim 3, wherein the predetermined ratio is substantially equal to 1.

5. The high voltage level shifter of claim 2, wherein the high-side receiver circuit comprises a first high-side cross-coupled device and a second high-side cross-coupled device, wherein each of the first high-side cross-coupled device and the second high-side cross-coupled device comprises:

a control terminal;
an output terminal; and
a common terminal;

wherein the common terminal of the first high-side cross-coupled device is connected to the control terminal of the second high-side cross-coupled device and the first high-side terminal of the first high voltage level shifter device; and wherein the common terminal of the second high-side cross-coupled device is connected to the control terminal of the first high-side cross-coupled device and the second high-side terminal of the second high voltage level shifter device.

6. The high voltage level shifter of claim 2, wherein the low-side control circuit comprises a first low-side cross-coupled device and a second cross-coupled device, wherein each of the first low-side cross-coupled device and the second cross-coupled device comprise:

a control terminal;
an output terminal; and
a common terminal;

wherein the common terminal of the first low-side cross-coupled device is connected to the control terminal of the second low-side cross-coupled device and to the first low-side terminal of the first high voltage level shifter device; and wherein the common terminal of the second low-side cross-coupled device is connected to the control terminal of the first low-side cross-coupled device and to the second low-side terminal of the second high voltage level shifter device.

7. The high voltage level shifter of claim 2, wherein a monolithic integrated circuit comprises the high voltage level shifter, and wherein the high-side receiver circuit is isolated from a substrate of the monolithic integrated circuit by an n-doped well connected to the positive rail of the high-side domain.

8. The high voltage level shifter of claim 7, wherein each of the first high-side cross-coupled device and the second high-side cross-coupled device is a vertical bipolar transistor;

wherein each corresponding control terminal of the first high-side cross-coupled device and the second high-side cross-coupled device is a base terminal of the vertical bipolar transistor;

wherein each corresponding common terminal of the first high-side cross-coupled device and the second high-side cross-coupled device is an emitter terminal of the vertical bipolar transistor;

wherein each corresponding output terminal of the first high-side cross-coupled device and the second high-side cross-coupled device is a collector terminal of the vertical bipolar transistor; and wherein each of an emitter region and a base region of the vertical bipolar transistor has no direct PN junction to the n-doped well.

9. The high voltage level shifter of claim 7, wherein each of the first high-side cross-coupled device and the second high-side cross-coupled device is a vertical MOS transistor;

wherein each corresponding control terminal of the first high-side cross-coupled device and the second high-side cross-coupled device is a gate terminal of the vertical MOS transistor;

wherein each corresponding common terminal of the first high-side cross-coupled device and the second high-side cross-coupled device is a source terminal of the vertical MOS transistor;

wherein each corresponding output terminal of the first high-side cross-coupled device and the second high-side cross-coupled device is a drain terminal of the vertical MOS transistor; and wherein a source region of the vertical MOS transistor has no direct PN junction to the n-doped well.

10. A method comprising:

receiving, via a low-side control circuit of a high voltage level shifter, an input signal from a low-side low voltage domain;

driving, by the low-side control circuit and in response to the received input signal, one of a first high voltage level shifter device and a second high voltage level shifter device to an active state while the other of the first high voltage level shifter device and the second high voltage level shifter device remains in an inactive state, wherein the first high voltage level shifter device comprises a first high-side terminal, a first low-side terminal, and a first control terminal, wherein the first control terminal is configured to control a first current flowing into the first high-side terminal to the first low-side terminal, wherein the second high voltage level shifter device comprises a second high-side terminal, a second low-side terminal, and a second control terminal, and wherein the second control terminal is configured to control a second current flowing into the second high-side terminal to the second low-side terminal;

setting, by a high-side receiver circuit, a state of a high-side output signal in response to a monitored first difference between the first current flowing into the first high-side terminal of the first high voltage level shifter device and the second current flowing into the second high-side terminal of the second high voltage level shifter device; and controlling, by the low-side control circuit and in response to a second difference between the first current monitored flowing out of the first low side terminal and the second current monitored flowing out of the second low side terminal, a concomitant control terminal of the first control terminal and the second control terminal corresponding to the one of the first high voltage level shifter device and the second high voltage level shifter device driven in the active state.

11. The method of claim 10, wherein each of the low-side low voltage domain and the high-side low voltage domain comprises a positive rail and a negative rail;
  the first high-side terminal of the first high voltage level shifter device is connected to the positive rail of the high-side domain via a first high-side current sensing device;
  the second high-side terminal of the second high voltage level shifter device is connected to the positive rail of the high-side domain via a second high-side current sensing device;
  the first low-side terminal of the first high voltage level shifter device is connected to the negative rail of the low-side domain via a first low-side current sensing device; and
  the second low-side terminal of the second high voltage level shifter device is connected to the negative rail of the low-side domain through a second low-side current sensing device.

12. The method of claim 11,
  wherein each of the first high-side current sensing device and the second high-side current sensing device comprise a resistor of a first value;
  wherein each of the first low-side current sensing device and the second low-side current sensing device comprise a resistor of a second value; and
  wherein the first value and the second value have a predetermined ratio.

13. The method of claim 12, wherein the predetermined ratio is substantially equal to 1.

14. The method of claim 11, wherein the high-side receiver circuit comprises a first high-side cross-coupled device and a second high-side cross-coupled device, wherein each of the first high-side cross-coupled device and the second high-side cross-coupled device comprises:
  a control terminal;
  an output terminal; and
  a common terminal;

wherein the common terminal of the first high-side cross-coupled device is connected to the control terminal of the second high-side cross-coupled device and the first high-side terminal of the first high voltage level shifter device; and
  wherein the common terminal of the second high-side cross-coupled device is connected to the control terminal of the first high-side cross-coupled device and the second high-side terminal of the second high voltage level shifter device.

15. The method of claim 11, wherein the low-side control circuit comprises a first low-side cross-coupled device and a second cross-coupled device, wherein each of the first low-side cross-coupled device and the second cross-coupled device comprise:
  a control terminal;
  an output terminal; and
  a common terminal;
  wherein the common terminal of the first low-side cross-coupled device is connected to the control terminal of the second low-side cross-coupled device and to the first low-side terminal of the first high voltage level shifter device; and
  wherein the common terminal of the second low-side cross-coupled device is connected to the control terminal of the first low-side cross-coupled device and to the second low-side terminal of the second high voltage level shifter device.

16. The method of claim 11, wherein a monolithic integrated circuit comprises the high voltage level shifter, and wherein the high-side receiver circuit is isolated from a substrate of the monolithic integrated circuit by an n-doped well connected to the positive rail of the high-side domain.

17. The method of claim 16,
  wherein each of the first high-side cross-coupled device and the second high-side cross-coupled device is a vertical bipolar transistor;
  wherein each corresponding control terminal of the first high-side cross-coupled device and the second high-side cross-coupled device is a base terminal of the vertical bipolar transistor;
  wherein each corresponding common terminal of the first high-side cross-coupled device and the second high-side cross-coupled device is an emitter terminal of the vertical bipolar transistor;
  wherein each corresponding output terminal of the first high-side cross-coupled device and the second high-side cross-coupled device is a collector terminal of the vertical bipolar transistor; and
  wherein each of an emitter region and a base region of the vertical bipolar transistor has no direct PN junction to the n-doped well.

18. The method of claim 16,
  wherein each of the first high-side cross-coupled device and the second high-side cross-coupled device is a vertical MOS transistor;
  wherein each corresponding control terminal of the first high-side cross-coupled device and the second high-side cross-coupled device is a gate terminal of the vertical MOS transistor;
  wherein each corresponding common terminal of the first high-side cross-coupled device and the second high-side cross-coupled device is a source terminal of the vertical MOS transistor;
  wherein each corresponding output terminal of the first high-side cross-coupled device and the second high-side cross-coupled device is a drain terminal of the vertical MOS transistor; and wherein a source region of the vertical MOS transistor has no direct PN junction to the n-doped well.

19. A high voltage level shifter configured to translate an input signal from a low-side low voltage domain to a high-side low voltage domain, the high voltage level shifter comprising:
- a first high voltage level shifter device, wherein the first high voltage level shifter device comprises a first high-side terminal, a first low-side terminal, and a first control terminal, and wherein the first control terminal is configured to control a first current flowing into the first high-side terminal to the first low-side terminal;
- a second high voltage level shifter device, wherein the second high voltage level shifter device comprises a second high-side terminal, a second low-side terminal, and a second control terminal, and wherein the second control terminal is configured to control a second current flowing into the second high-side terminal to the second low-side terminal;
- means for low-side control, wherein the means for low-side control is configured to drive the first control terminal and the second control terminal, wherein the means for low-side control is further configured to drive, in response to the input signal, one of the first high voltage level shifter device and the second high voltage level shifter device to an active state while the other of the first high voltage level shifter device and the second high voltage level shifter device remains in an inactive state;
- means for high-side receiving, wherein the means for high-side receiving is configured to set a state of a high-side output signal in response to the one of the first high voltage level shifter device and the second high voltage level shifter device driven in the active state;
- wherein the means for high-side receiving is configured to monitor a first difference between the first current flowing into the first high-side terminal of the first high voltage level shifter device and the second current flowing into the second high-side terminal of the second high voltage level shifter device; and
- wherein the means for low-side control is configured to control a concomitant control terminal of the first control terminal and the second control terminal corresponding to the one of the first high voltage level shifter device and the second high voltage level shifter device driven in the active state in response to a second difference between the first current monitored flowing out of the first low side terminal and the second current monitored flowing out of the second low side terminal.

20. The high voltage level shifter of claim 19, wherein each of the low-side low voltage domain and the high-side low voltage domain comprises a positive rail and a negative rail;
- the first high-side terminal of the first high voltage level shifter device is connected to the positive rail of the high-side domain via a first high-side current sensing device;
- the second high-side terminal of the second high voltage level shifter device is connected to the positive rail of the high-side domain via a second high-side current sensing device;
- the first low-side terminal of the first high voltage level shifter device is connected to the negative rail of the low-side domain via a first low-side current sensing device; and
- the second low-side terminal of the second high voltage level shifter device is connected to the negative rail of the low-side domain through a second low-side current sensing device.

* * * * *